(12) United States Patent
Higashira et al.

(10) Patent No.: US 11,310,917 B2
(45) Date of Patent: Apr. 19, 2022

(54) METHOD FOR MANUFACTURING SUBSTRATE FOR FLEXIBLE PRINTED WIRING BOARD, AND SUBSTRATE FOR FLEXIBLE PRINTED WIRING BOARD

(71) Applicant: NIPPON MEKTRON, LTD., Tokyo (JP)

(72) Inventors: Toshihiro Higashira, Tokyo (JP); Fuki Hatano, Tokyo (JP)

(73) Assignee: NIPPON MEKTRON, LTD., Tokyo (JP)

( * ) Notice: Subject to any disclaimer, the term of this patent is extended or adjusted under 35 U.S.C. 154(b) by 0 days.

(21) Appl. No.: 17/020,936

(22) Filed: Sep. 15, 2020

(65) Prior Publication Data

US 2021/0084768 A1   Mar. 18, 2021

(30) Foreign Application Priority Data

Sep. 17, 2019   (JP) .............................. JP2019-168556

(51) Int. Cl.
*H05K 1/03* (2006.01)
*H05K 3/00* (2006.01)
*H05K 1/02* (2006.01)

(52) U.S. Cl.
CPC .......... *H05K 3/0064* (2013.01); *H05K 1/028* (2013.01); *H05K 1/036* (2013.01); *H05K 1/0366* (2013.01);
(Continued)

(58) Field of Classification Search
CPC .... H05K 3/0064; H05K 1/036; H05K 1/0393; H05K 1/028; H05K 1/0366; H05K 2203/06; H05K 2201/0195; H05K 2203/386; H05K 2201/015; H05K 2201/068; H05K 2201/0154
(Continued)

(56) References Cited

U.S. PATENT DOCUMENTS 6,417,459 B1 * 7/2002 Kanzaki ............... D03D 15/267
174/254
8,143,530 B1 * 3/2012 Das ....................... H05K 3/4626
174/256
(Continued)

FOREIGN PATENT DOCUMENTS

WO   2016181936 A1   11/2016
WO   2017154926 A1   9/2017

*Primary Examiner* — Sherman Ng
(74) *Attorney, Agent, or Firm* — Studebaker & Brackett PC

(57) ABSTRACT

Provided is a method for manufacturing a substrate for flexible printed wiring board, comprising a laminated body forming step and an integration step, wherein in the laminated body forming step, on an upper surface and a lower surface of a fluororesin layer having a modified surface, a first and second reinforcing resin layers having a coefficient of thermal expansion smaller than that of the fluororesin layer are respectively stacked through a first thermosetting adhesive, on the first reinforcing resin layer and/or the second reinforcing resin layer, a conductor layer is stacked through a second thermosetting adhesive, to form a laminated body, and in the integration step, the laminated body is heated and integrated at a temperature not lower than a curing temperature of the first and second thermosetting adhesives and lower than a melting point of the fluororesin layer.

15 Claims, 9 Drawing Sheets

(52) U.S. Cl.
CPC ....... *H05K 1/0393* (2013.01); *H05K 2203/06* (2013.01)

(58) Field of Classification Search
USPC ........................................ 174/254, 256, 259
See application file for complete search history.

(56) References Cited

U.S. PATENT DOCUMENTS

| | | | |
|---|---|---|---|
| 2010/0000771 A1* | 1/2010 | Shimauchi | B32B 7/12 174/257 |
| 2016/0250830 A1* | 9/2016 | Kiya | H05K 3/20 174/258 |
| 2017/0327630 A1* | 11/2017 | Kiya | H05K 3/281 |
| 2018/0050516 A1 | 2/2018 | Hosoda et al. | |
| 2018/0332710 A1* | 11/2018 | Lin | H05K 1/024 |
| 2019/0008053 A1 | 1/2019 | Sasaki et al. | |
| 2019/0215947 A1* | 7/2019 | Du | H05K 1/024 |

\* cited by examiner

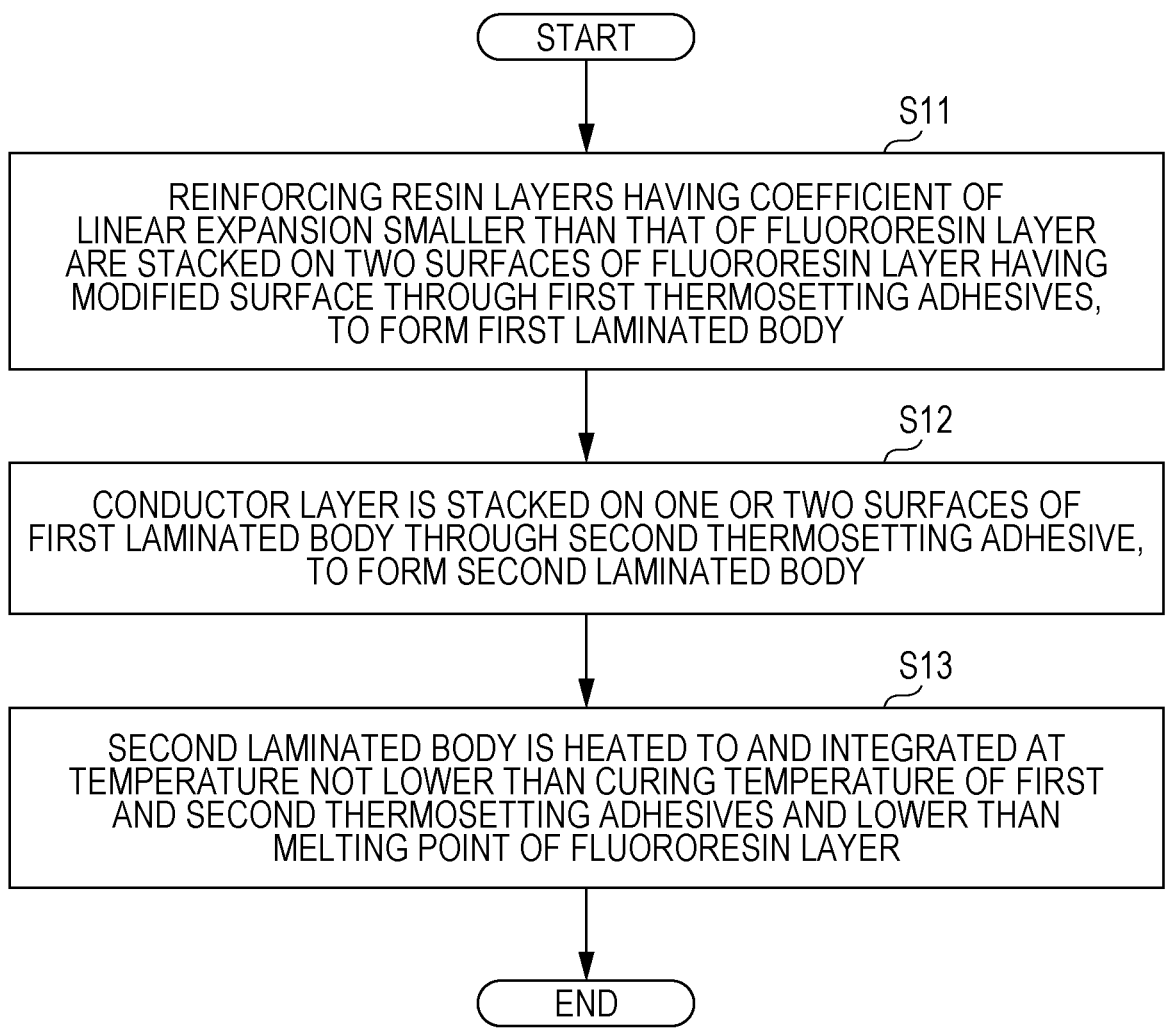

METHOD FOR MANUFACTURING SUBSTRATE FOR FLEXIBLE PRINTED WIRING BOARD, AND SUBSTRATE FOR FLEXIBLE PRINTED WIRING BOARD

CROSS-REFERENCE TO RELATED APPLICATION

This application claims priority from Japanese Patent Application No. 2019-168556 filed with the Japan Patent Office on Sep. 17, 2019, the entire content of which is hereby incorporated by reference.

BACKGROUND

1. Technical Field

The present disclosure relates to a method for manufacturing a substrate for flexible printed wiring board, and the substrate for flexible printed wiring board, and more specifically, a method for manufacturing a substrate for flexible printed wiring board with an insulating base material having a fluororesin layer and suitable for transmitting a high frequency signal, and the substrate for the flexible printed wiring board.

2. Related Art

In recent years, along with development of fifth generation mobile communication systems (5G) and the like, there is an increasing demand for printed wiring boards with low transmission loss in a high frequency region. In order to reduce the transmission loss of the printed wiring board, it is necessary to reduce relative permittivity and dielectric loss tangent (tan δ) of the insulating base material.

In the flexible printed wiring board, films made of polyimide (PI) or liquid crystal polymer (LCP) have been used as the insulating base material. However, these materials have relatively large relative permittivity and loss tangent in the high frequency region. Therefore, it is difficult to sufficiently reduce the transmission loss for the high frequency signal. Therefore, employing the fluororesin having a small relative permittivity and dielectric loss tangent for an insulating layer of the flexible printed wiring board has been studied.

However, it is difficult to secure an adhesive force between the fluororesin and another material (a conductor layer such as a copper foil or the insulating base material such as a polyimide film). Specifically, when the fluororesin such as polytetrafluoroethylene (PTFE) or tetrafluoroethylene-perfluoroalkyl vinyl ether copolymer (PFA) is used, dielectric properties of the flexible printed wiring board are improved. However, it is difficult to secure adhesiveness with other materials. Therefore, there is a problem that the fluororesin layer and other insulating layers or conductor layers are easily separated from each other when the flexible printed wiring board is manufactured or used.

WO 2016/181936 and WO 2017/154926 describe that the fluororesin is bonded to the conductor layer or another insulating layer (PI, LCP or the like) by copolymerizing the fluororesin and a component having adhesiveness.

SUMMARY

A method for manufacturing a substrate for flexible printed wiring board according to an embodiment of the present disclosure includes a laminated body forming step and an integration step, wherein in the laminated body forming step, on an upper surface and a lower surface of a fluororesin layer having a modified surface, a first and second reinforcing resin layers having a coefficient of thermal expansion smaller than that of the fluororesin layer are respectively stacked through a first thermosetting adhesive, on the first reinforcing resin layer and/or the second reinforcing resin layer, a conductor layer is stacked through a second thermosetting adhesive, to form a laminated body, and in the integration step, the laminated body is heated and integrated at a temperature not lower than a curing temperature of the first and second thermosetting adhesives and lower than a melting point of the fluororesin layer.

BRIEF DESCRIPTION OF THE DRAWINGS

FIG. 1 is a flowchart illustrating a method for manufacturing a substrate for flexible printed wiring board according to a first embodiment;

DETAILED DESCRIPTION

Figure 2A:
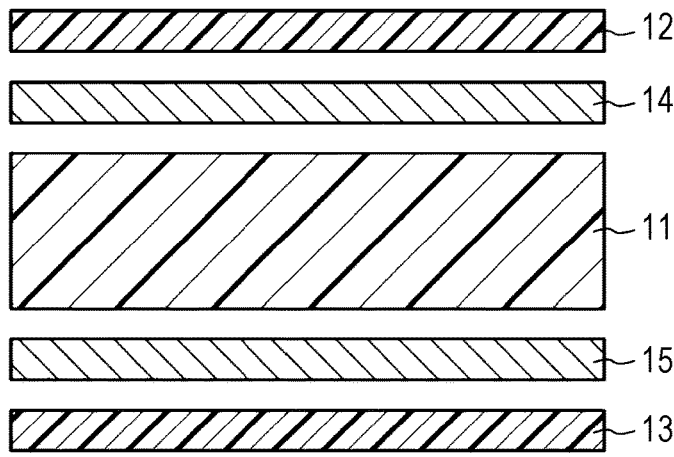
FIG. 2A is a process cross-sectional view for explaining the method for manufacturing the substrate for flexible printed wiring board according to the first embodiment.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

However, a fluororesin has a coefficient of thermal expansion (CTE) larger than other dielectrics. Therefore, when a substrate for flexible printed wiring board is produced by stacking a fluororesin layer and another insulating base material or a conductor layer, there is a problem that it is difficult to ensure dimensional stability. This problem will be described in more detail.

When the substrate for flexible printed wiring board is produced, the fluororesin layer and another insulating layer or conductor layer are stacked. Then, the obtained laminated body is integrated by heating under pressure, and then cooled to room temperature. When heating temperature in an integration step is high (specifically when the temperature is not lower than a melting point of the fluororesin), a large residual strain occurs in the fluororesin layer after cooling to room temperature.

If the residual strain of the fluororesin layer is large, when the conductor layer is etched to form lines of the flexible printed wiring board (or for example, when through-holes are formed), the fluororesin layer shrinks so that the residual strain is released. As a result, a dimension between lines or through-holes provided in the flexible printed wiring board deviates from a designed value.

The present disclosure has been made based on such technical recognition. An object of the present disclosure is to provide the substrate for flexible printed wiring board having high dimensional stability, that can produce the flexible printed wiring board suitable for transmitting a high frequency signal and capable of suppressing delamination, and a method for manufacturing the substrate for flexible printed wiring board.

A method for manufacturing a substrate for flexible printed wiring board according to a first aspect of the present embodiment includes a laminated body forming step and an integration step, wherein in the laminated body forming step, on an upper surface and a lower surface of a fluororesin layer having a modified surface, a first and second reinforcing resin layers having a coefficient of thermal expansion smaller than that of the fluororesin layer are respectively stacked through a first thermosetting adhesive, on the first reinforcing resin layer and/or the second reinforcing resin layer, a conductor layer is stacked through a second thermosetting adhesive, to form a laminated body, and in the integration step, the laminated body is heated and integrated at a temperature not lower than a curing temperature of the first and second thermosetting adhesives and lower than a melting point of the fluororesin layer.

A method for manufacturing a substrate for flexible printed wiring board according to a second aspect of the present embodiment includes a laminated body forming step and an integration step, wherein in the laminated body forming step, on an upper surface and a lower surface of a fluororesin layer having a modified surface, a first and second reinforcing resin layers having a coefficient of thermal expansion smaller than that of the fluororesin layer are respectively stacked through a first thermosetting adhesive, on the first reinforcing resin layer and/or the second reinforcing resin layer, a single-sided conductor-clad laminate including a conductor layer and a third reinforcing resin layer stacked on one surface of the conductor layer is stacked through a second thermosetting adhesive so that the conductor layer faces outward, to form a laminated body, and in the integration step, the laminated body is heated and integrated at a temperature not lower than a curing temperature of the first and second thermosetting adhesives and lower than a melting point of the fluororesin layer.

A method for manufacturing a substrate for flexible printed wiring board according to a third aspect of the present embodiment includes preparing a fluororesin layer having a modified surface, preparing a first single-sided conductor-clad laminate including a first conductor layer and a first reinforcing resin layer stacked on one surface of the first conductor layer and having a coefficient of thermal expansion smaller than that of the fluororesin layer, preparing a second single-sided conductor-clad laminate including a second conductor layer and a second reinforcing resin layer stacked on one surface of the second conductor layer and having a coefficient of thermal expansion smaller than that of the fluororesin layer, and a laminated body forming step and an integration step, wherein in the laminated body forming step, on an upper surface of the fluororesin layer, the first single-sided conductor-clad laminate is stacked through a first thermosetting adhesive so that the first conductor layer faces outward, on a lower surface of the fluororesin layer, the second single-sided conductor-clad laminate is stacked through a second thermosetting adhesive so that the second conductor layer faces outward, to form a laminated body, and in the integration step, the laminated body is heated and integrated at a temperature not lower than a curing temperature of the first and second thermosetting adhesives and lower than a melting point of the fluororesin layer.

A substrate for flexible printed wiring board according to the first aspect of the present embodiment includes a fluororesin layer having a modified surface, a first reinforcing resin layer stacked on an upper surface of the fluororesin layer through a cured adhesive layer and having a coefficient of thermal expansion smaller than that of the fluororesin layer, a second reinforcing resin layer stacked on a lower surface of the fluororesin layer through a cured adhesive layer and having a coefficient of thermal expansion smaller than that of the fluororesin layer, and a conductor layer stacked on the first reinforcing resin layer and/or the second reinforcing resin layer through the cured adhesive layer.

A substrate for flexible printed wiring board according to the second aspect of the present embodiment includes a fluororesin layer having a modified surface, a first reinforcing resin layer stacked on an upper surface of the fluororesin layer through a cured adhesive layer and having a coefficient of thermal expansion smaller than that of the fluororesin layer, a second reinforcing resin layer stacked on a lower surface of the fluororesin layer through a cured adhesive layer and having a coefficient of thermal expansion smaller than that of the fluororesin layer, a third reinforcing resin layer stacked on the first reinforcing resin layer and/or the second reinforcing resin layer through the cured adhesive layer, and a conductor layer stacked on the third reinforcing resin layer.

A substrate for flexible printed wiring board according to the third aspect of the present embodiment includes a fluororesin layer having a modified surface, a first reinforcing resin layer stacked on an upper surface of the fluororesin layer through a cured adhesive layer and having a coefficient of thermal expansion smaller than that of the fluororesin layer, a second reinforcing resin layer stacked on a lower surface of the fluororesin layer through a cured adhesive layer and having a coefficient of thermal expansion smaller than that of the fluororesin layer, and a conductor layer stacked on the first reinforcing resin layer and/or the second reinforcing resin layer.

According to the present disclosure, there is provided the substrate for flexible printed wiring board having high dimensional stability, that can produce the flexible printed wiring board suitable for transmitting the high frequency signal and capable of suppressing delamination, and the method for manufacturing the substrate for flexible printed wiring board.

Hereinafter, embodiments according to the present disclosure will be described with reference to the drawings.

In each figure, the components having the same function are denoted by the same reference numerals. In addition, the cross-sectional view is a schematic view. Therefore, a ratio of thickness of each layer illustrated in the figure, or the like is not always equal to an actual ratio.

First Embodiment

<Method for Manufacturing Substrate for Flexible Printed Wiring Board According to First Embodiment>

The method for manufacturing the substrate for flexible printed wiring board according to a first embodiment will be described with reference to a flowchart of FIG. 1.

Figure 2B:
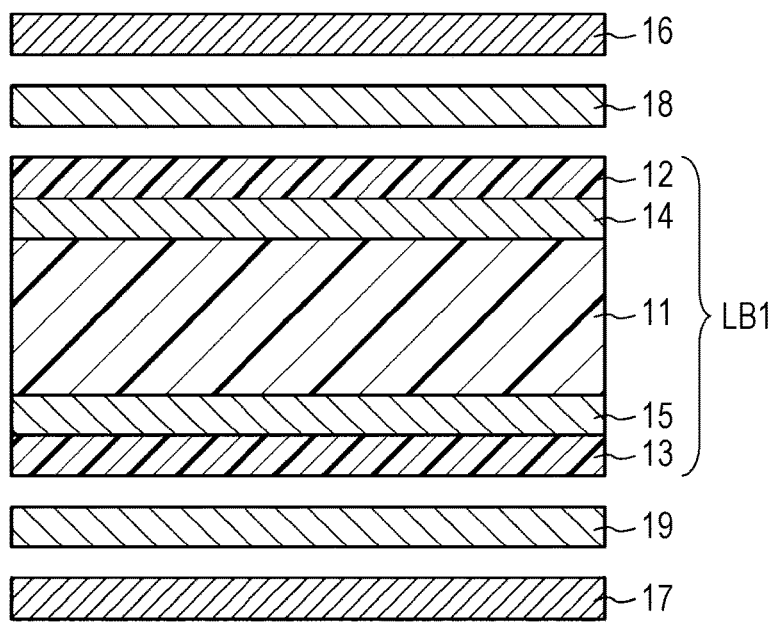
FIG. 2B is a process cross-sectional view subsequent to FIG. 2A, for explaining the method for manufacturing the substrate for flexible printed wiring board according to the first embodiment.

First, reinforcing resin layers having a coefficient of thermal expansion smaller than that of the fluororesin layer are stacked on two surfaces of the fluororesin layer having the modified surface through first thermosetting adhesives. In this way, a first laminated body is formed (Step S11). In the present embodiment, as illustrated in FIGS. 2A and 2B, on two surfaces of a fluororesin layer (fluororesin film) 11 having the modified surface, reinforcing resin layers 12 and 13 having a coefficient of thermal expansion smaller than that of the fluororesin layer 11 are stacked through thermosetting adhesives 14 and 15. In this way, a laminated body LB1 is formed.

That is, in Step S11, the reinforcing resin layer 12 is stacked on an upper surface of the fluororesin layer 11 through the thermosetting adhesive 14. Then, the reinforcing resin layer 13 is stacked on a lower surface of the fluororesin layer 11 through the thermosetting adhesive 15. As a specific procedure, for example, the thermosetting adhesive 14 is applied to the upper surface of the fluororesin layer 11, and then the reinforcing resin layer 12 is attached to the fluororesin layer 11. Similarly, after the thermosetting adhesive 15 is applied to the lower surface of the fluororesin layer 11, the reinforcing resin layer 13 is attached to the fluororesin layer 11. Thus, the laminated body LB1 is formed. The reinforcing resin layer and the fluororesin layer are preferably bonded together under heating at a temperature lower than a glass transition temperature of each resin layer (for example, 60 to 80° C.) (so-called temporary lamination). Of course, the reinforcing resin layers 12 and 13 having the thermosetting adhesive applied in advance may be stacked on the fluororesin layer 11.

The fluororesin layer 11 is, for example, made of tetrafluoroethylene-perfluoroalkyl vinyl ether copolymer (PFA), tetrafluoroethylene-hexafluoropropylene copolymer (FEP), polytetrafluoroethylene (PTFE), ethylene-tetrafluoroethylene copolymer (ETFE), or polyvinylidene fluoride (PVDF). These fluororesins have flexibility, heat resistance, and flame retardancy.

The fluororesin layer 11 may contain an inorganic filler having a low dielectric constant or dielectric loss tangent. Examples of the inorganic filler include silica, clay, talc, calcium carbonate, mica, diatomaceous earth, alumina, zinc oxide, titanium oxide, calcium oxide, magnesium oxide, boron nitride, iron oxide, tin oxide, antimony oxide, calcium hydroxide, magnesium hydroxide, aluminum hydroxide, basic magnesium carbonate, magnesium carbonate, zinc carbonate, barium carbonate, dawsonite, hydrotalcite, calcium sulfate, barium sulfate, calcium silicate, montmorillonite, bentonite, activated clay, sepiolite, imogolite, sericite, glass fibers, glass beads, silica-based balloons, carbon black, carbon nanotubes, carbon nanohorns, graphite, carbon fibers, silicon fibers, LCP fibers, glass balloons, carbon balloons, wood powder, and zinc borate. The fluororesin layer 11 may contain only one kind of inorganic filler, or may contain two or more kinds of inorganic fillers.

Content of the inorganic filler is preferably 0.1 to 100 mass %, and more preferably 0.1 to 60 mass % based on fluorocopolymer. When the inorganic filler is porous, the dielectric constant and the dielectric loss tangent of the fluororesin layer 11 can be further reduced. Further, dispersibility of the inorganic filler in the fluorocopolymer may be improved by surface treatment using a surface treatment agent such as a silane coupling agent or a titanate coupling agent.

In order to reduce the coefficient of thermal expansion of the fluororesin, the fluororesin layer 11 may contain aramid fiber woven cloth, aramid fiber non-woven cloth, aramid paper, aramid film, glass fiber woven cloth, cotton woven cloth, paper or the like in the fluororesin.

The thickness of the fluororesin layer 11 is, for example, 5 to 200 and preferably 7.5 to 100 When the thickness is larger than an upper limit of 200 it is difficult to ensure handleability and dimensional stability. On the other hand, when the thickness is smaller than a lower limit of 5 dielectric properties and flexibility of the substrate for flexible printed wiring board deteriorate.

The fluororesin layer 11 is not limited to a single layer film but may include a plurality of films stacked. In this case, a material of each film may be different from each other. It is also possible to stack each layer having a bonding surface modified in advance, through the thermosetting adhesive. In this case, adhesive strength after the integration step can be secured.

Here, modification of the surface of the fluororesin layer 11 will be described.

In surface modification, any one of a monomer, an oligomer, and a polymer having a functional group having high hydrophilicity, or a mixture thereof (hereinafter, also simply referred to as a "modifier") is brought into contact with an active site formed on the surface of the fluororesin layer 11. By surface modification, a so-called tack feeling is obtained on the surface of the fluororesin layer 11.

Examples of the method for forming the active site on the surface of the fluororesin layer 11 include a method of irradiating with active rays such as ultraviolet rays (UV) and excimer laser light, and a method of using discharge such as corona discharge and plasma discharge. Another example is a method of immersing the fluororesin layer 11 in an alkali metal complex solution.

Examples of a method of contacting the fluororesin layer 11 with the modifier include a method of directly contacting the fluororesin layer 11 with a gaseous or liquid modifier. As another example, the fluororesin layer 11 may be contacted with a mixed gas containing a modifier diluted with a carrier gas, or an aqueous solution or organic solvent solution containing a dissolved modifier.

When the active rays are irradiated for forming the active site on the fluororesin layer 11, it is also effective to irradiate the gaseous or liquid modifier in direct contact with the fluororesin layer 11 with active rays. Alternatively, the mixed gas containing the modifier diluted with the carrier gas, or the aqueous solution or organic solvent solution containing the dissolved modifier, that is in contact with the fluororesin layer 11, may be irradiated with active rays.

Vacuum plasma treatment is an effective method for the surface modification. In the vacuum plasma treatment, glow discharge or the like in vacuum is started by applying DC or AC high voltage between electrodes. Then, a base material to be treated (here, the fluororesin layer 11) is exposed to continuous glow discharge or the like in vacuum. A selection range of treatment gas (the modifier) used for the vacuum plasma treatment is relatively wide. For example, He, Ne, Ar, $N_2$, $O_2$, carbon dioxide, air, steam, or ammonia gas can be used as the treatment gas. A mixed gas of these gases may be used. Specifically, good results can be obtained by using $N_2$ gas, $N_2+H_2$ gas (mixed gas of nitrogen and hydrogen), $N_2+O_2$ gas (mixed gas of nitrogen and oxygen), or ammonia gas.

A hydrophilic functional group such as $NH_2$ group, COOH group, or OH group is added to the surface of the fluororesin layer 11 subjected to the vacuum plasma treatment, depending on the treatment gas. Therefore, as described below, the adhesive strength between the fluororesin layer 11 and the reinforcing resin layers 12 and 13 can be secured even at a relatively low heating temperature lower than the melting point of the fluororesin layer 11.

Next, the reinforcing resin layers 12 and 13 will be described. The reinforcing resin layers 12 and 13 have a coefficient of thermal expansion smaller than that of the fluororesin layer 11. For example, the coefficient of thermal expansion of the reinforcing resin layers 12 and 13 is preferably 30 ppm/° C. or less, and more preferably 25 ppm/° C. or less. Here, a value of the coefficient of thermal expansion is a value at room temperature (the same applies to the following numerical values). By using the reinforcing resin layers 12 and 13 having a coefficient of thermal expansion of 30 ppm/° C. or less, it is possible to suppress occurrence of warpage and reduction in dimensional stability of a substrate 1 for flexible printed wiring board manufactured by a manufacturing method according to the present embodiment.

An elastic modulus of the reinforcing resin layers 12 and 13 is preferably 3 GPa or more, and more preferably 6 GPa or more. Here, a value of the elastic modulus is a value at room temperature (the same applies to the following numerical values). Thus, it is possible to reduce shrinkage ratio of the laminated body (substrate 1 for flexible printed wiring board), for example, when cooling the laminated body after the integration step (described below), or when patterning conductor layers 16 and 17 of the laminated body. Therefore, the dimensional stability can be improved.

If the elastic modulus of the reinforcing resin layers 12 and 13 is relatively large, a condition of the coefficient of thermal expansion can be relaxed. For example, when the elastic modulus is 3 GPa or more and the coefficient of thermal expansion of the reinforcing resin layers 12 and 13 is 50 ppm/° C. or less, the dimensional stability can be ensured.

Examples of material of the reinforcing resin layers 12 and 13 used include polyimide such as aromatic polyimide, liquid crystal polymer (LCP), and polyether ether ketone (PEEK). Other examples include polyarylate, polysulfone, polyallylsulfone (polyethersulfone or the like), aromatic polyamide, aromatic polyetheramide, polyphenylene sulfide, polyallyl ether ketone, polyamideimide, and liquid crystalline polyester.

LCP and PEEK have a relatively small water absorption rate as compared with polyimide and the like. Therefore, by using these materials for the reinforcing resin layers 12 and 13, it is possible to suppress an increase in the dielectric constant and an increase in the dielectric loss tangent due to moisture absorption when the substrate 1 for flexible printed wiring board is tested or used.

The thickness of the reinforcing resin layers 12 and 13 is, for example, 5 to 200 and preferably 7.5 to 100 When the thickness is smaller than the lower limit of 5 it is difficult to ensure the handleability and the dimensional stability. On the other hand, when the thickness is larger than the upper limit of 200 the dielectric properties and the flexibility of the substrate 1 for flexible printed wiring board deteriorate.

Each of the reinforcing resin layers 12 and 13 is not limited to one layer, and may include a multilayer film. For example, a thermoplastic resin and a non-thermoplastic resin that are bonded to each other may form the reinforcing resin layer. Thus, the reinforcing resin layer having high flexibility can be obtained.

Like the fluororesin layer 11, the surfaces of the reinforcing resin layers 12 and 13 may also be modified by vacuum plasma treatment or the like. By adding the functional group to the surfaces of the reinforcing resin layers 12 and 13 (at least the surfaces facing the fluororesin layer 11), it is possible to increase the adhesive strength between the fluororesin layer 11 and the reinforcing resin layers 12 and 13 in the integration step (Step S13) described below.

The thermosetting adhesives 14 and 15 contain a thermosetting resin that cures at a predetermined temperature as a main component. A lower limit of a curing temperature of the thermosetting adhesives 14 and 15 is, for example, preferably 120° C., and more preferably 150° C. On the other hand, an upper limit of the curing temperature is, for example, preferably 250° C., more preferably 230° C., further preferably 200° C. or less. As the upper limit of the curing temperature is lower, the temperature of the integration step described below can be lower. Therefore, the residual strain of the fluororesin layer 11 after cooling to room temperature can be reduced.

The thermosetting adhesives 14 and 15 preferably have excellent heat resistance. Suitable examples thereof include modified polyolefin resin-based, epoxy resin-based, polyimide resin-based, butyral resin-based, acrylic resin-based, and bismaleimide resin-based adhesives. Other examples include polyolefin resin-based adhesive, polyphenylene ether resin adhesive, and styrene-based resin adhesive. Although the heat resistance of these adhesives is slightly inferior, these adhesives can be used depending on conditions such as heating temperature.

The thickness of the thermosetting adhesives 14 and 15 is, for example, 2 to 200 and preferably 4 to 100 When the thickness is smaller than the lower limit of 2 it is difficult to ensure the dimensional stability. On the other hand, when the thickness is larger than the upper limit of 200 the dielectric properties and the flexibility of the substrate for flexible printed wiring board deteriorate.

Figure 2C:
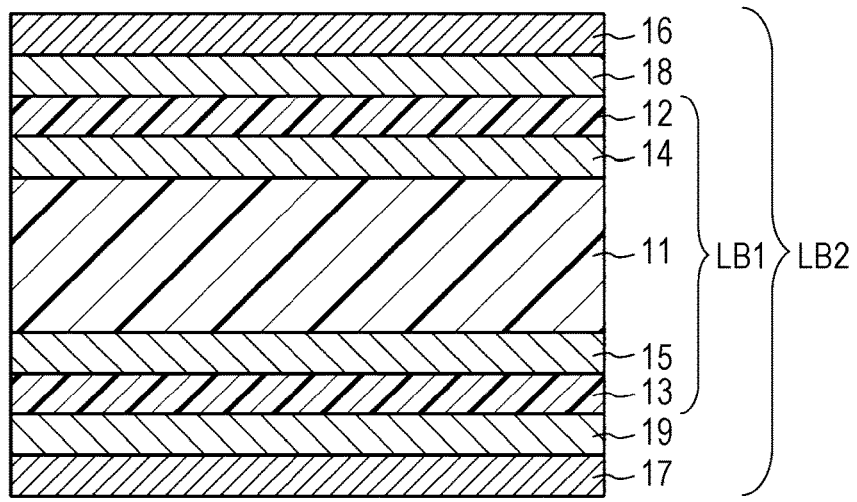
FIG. 2C is a process cross-sectional view subsequent to FIG. 2B, for explaining the method for manufacturing the substrate for flexible printed wiring board according to the first embodiment.

Subsequently, the conductor layer is stacked on one or two surfaces of the first laminated body through a second thermosetting adhesive. In this way, a second laminated body is formed (Step S12). In the present embodiment, as illustrated in FIGS. 2B and 2C, the conductor layers 16 and 17 are stacked on two surfaces of the laminated body LB1 through thermosetting adhesives 18 and 19. In this way, a laminated body LB2 is formed.

In Step S12, the thermosetting adhesive 18 is applied to the reinforcing resin layer 12 of the laminated body LB1, and then the conductor layer 16 is bonded to the laminated body LB1. Similarly, after the thermosetting adhesive 19 is applied to the reinforcing resin layer 13 of the laminated body LB1, the conductor layer 17 is bonded to the laminated body LB1. The reinforcing resin layer and the conductor layer are bonded together at a temperature lower than the glass transition temperature of each resin layer (for example, 60 to 80° C.) (so-called temporary lamination). Of course, the conductor layers 16 and 17 having the thermosetting adhesives applied in advance may be stacked on the laminated body LB1.

In an example of FIG. 2B, the conductor layers are stacked on the two surfaces (upper surface and lower surface) of the laminated body LB1 through the thermosetting adhesives. However, the present disclosure is not limited to this, but the conductor layer may be stacked only on one surface of the laminated body LB1 through the thermosetting adhesive.

The conductor layers 16 and 17 are made of conductor such as copper, copper alloy, stainless steel, nickel, nickel alloy (including 42 alloy), aluminum, or aluminum alloy. In the present embodiment, the conductor layers 16 and 17 are copper foils such as rolled copper foil or electrolytic copper foil.

The thickness of the conductor layers 16 and 17 is not particularly limited as long as the conductor layers 16 and 17 can exhibit a sufficient function depending on application of the flexible printed wiring board. In consideration of the flexibility or the like of the flexible printed wiring board, the thickness of the conductor layers 16 and 17 is preferably 6 to 70 μm, and more preferably 9 to 35 μm.

Surfaces facing the reinforcing resin layers 12 and 13 out of main surfaces of the conductor layers 16 and 17 may be chemically or mechanically surface-treated in order to improve adhesiveness between the reinforcing resin layer and the insulating layer. Examples of chemical surface treatment include plating treatment such as nickel plating and copper-zinc alloy plating, and treatment with surface treating agent such as aluminum alcoholate, aluminum chelate, and silane coupling agent. Among them, the surface treatment with the silane coupling agent is preferable. As the silane coupling agent, a silane coupling agent having an amino group can be preferably used. On the other hand, examples of mechanical surface treatment include surface roughening treatment.

A ten-point average roughness (Rz) of the conductor layers 16 and 17 is preferably 4.0 μm or less, and more preferably 2.0 μm or less in consideration of transmission of the high frequency signal. Thus, even if current of the high frequency signal flows only in a surface layer portion of the conductor layer due to skin effects, a propagation distance of the signal is suppressed from increasing. As a result, a transmission rate can be maintained when the high frequency signal is transmitted. Then, it is possible to suppress an increase in transmission loss.

The thermosetting adhesives 18 and 19 are adhesives having the same materials and properties as the thermosetting adhesives 14 and 15 described above. Therefore, their detailed description will be omitted.

Subsequently, the second laminated body is heated and integrated to a temperature not lower than the curing temperature of the first thermosetting adhesive and the second thermosetting adhesive and lower than the melting point of the fluororesin layer (Step S13). Hereinafter, Step S13 is also referred to as the "integration step". In the present embodiment, as illustrated in FIG. 2C, the laminated body LB2 formed in Step S12 is heated and integrated to a temperature not lower than the curing temperature of the thermosetting adhesives 14, 15, 18 and 19 and lower than the melting point of the fluororesin layer 11.

More specifically, in the integration step, the laminated body LB2 is heated under pressure at the curing temperature of the thermosetting adhesive or higher. Thus, the thermosetting adhesives 14, 15, 18 and 19 are cured. In this way, the laminated body LB2 is integrated. At this time, since the heating temperature is lower than the melting point of the fluororesin layer 11, expansion of the fluororesin layer 11 is suppressed. As a result, the residual strain of the fluororesin layer 11 after cooling to room temperature can be reduced. Further, the surface of the fluororesin layer 11 is modified. Therefore, the adhesive strength can be sufficiently secured even at the heating temperature lower than the melting point of the fluororesin layer 11.

More specifically, the integration step includes a vacuum pressing step and a post-curing step. In the vacuum pressing step, the laminated body LB2 sandwiched between a pair of metal plates (stainless steel plates or the like) and covered with a protective film made of polyimide or the like is heated under pressure. In the post-curing step, the laminated body LB2 that has undergone the vacuum pressing step is heated in an air heating oven or a nitrogen substitution heating oven. In this way, thermal curing of the thermosetting adhesives 14, 15, 18 and 19 is completed. For example, in the vacuum pressing step, the laminated body LB2 is heated under pressure at a temperature of about 200° C. for about 3 minutes. In the post-curing step, the laminated body LB2 is heated at a temperature of about 200° C. for about 60 minutes.

The integration step may not include the post-curing step. In this case, for example, the vacuum pressing step is performed at 130 to 250° C. (preferably 170 to 200° C.) for about 60 minutes. The integration step may be performed by a roll-to-roll method in addition to vacuum pressing. In this case, a predetermined region of a sheet unwound from a metal roll is heated under pressure. After the treatment is complete, the metal roll is rotated to initiate pressure heating for another region.

After the integration step, the heated laminated body LB2 is cooled to room temperature.

The integration step is performed at a temperature lower than the melting point of the fluororesin layer 11. However, in order to sufficiently ensure the dimensional stability, heating at a temperature of 250° C. or lower is preferable.

As the curing temperature of the thermosetting adhesive is higher, the temperature of the integration process is preferably higher. Then, as the temperature of the integration step is higher, the residual strain of the fluororesin layer 11 having a large coefficient of thermal expansion is larger when the laminated body is cooled to room temperature. Therefore, in order to reduce the residual strain, the thermosetting adhesive may be cured by heating at a lower temperature for a longer time in the integration step.

Figure 3:
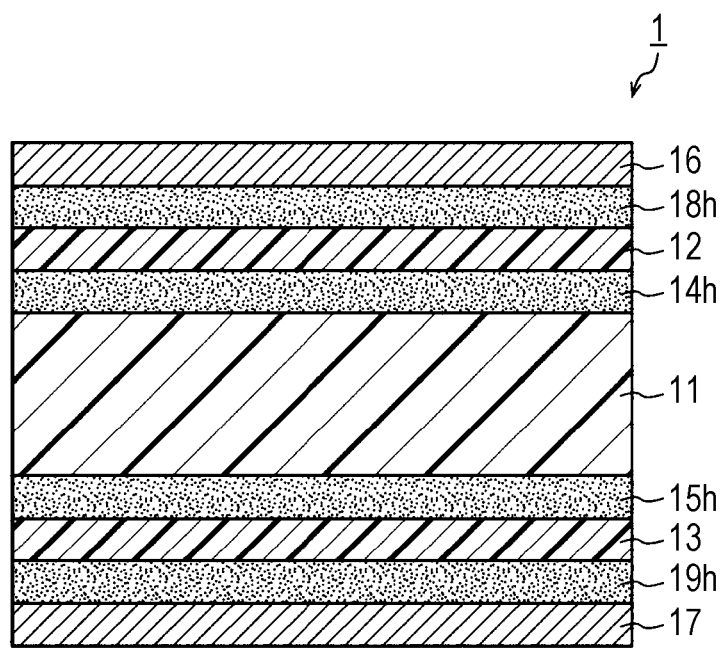
FIG. 3 is a cross-sectional view of the substrate for flexible printed wiring board according to the first embodiment.

Through the steps described above, the substrate 1 for flexible printed wiring board according to the first embodiment illustrated in FIG. 3 is manufactured. Cured adhesive layers 14h, 15h, 18h and 19h are respectively insulating layers containing the cured thermosetting adhesives 14, 15, 18 and 19.

In the above manufacturing method, the conductor layers 16 and 17 are stacked on the laminated body LB1 previously formed to form the laminated body LB2. However, the present embodiment is not limited to the above manufacturing method. That is, stacking order of layers for forming the laminated body LB2 can be appropriately changed. As another example of stacking, first, the reinforcing resin layer 12 is stacked on the upper surface of the fluororesin layer 11 through the thermosetting adhesive 14. Then, the conductor layer 16 is stacked on the reinforcing resin layer 12 through the thermosetting adhesive 18. Subsequently, the reinforcing resin layer 13 is stacked on the lower surface of the fluororesin layer 11 through the thermosetting adhesive 15. Then, the conductor layer 17 may be stacked on the reinforcing resin layer 13 through the thermosetting adhesive 19.

Therefore, it can be understood that the method for manufacturing the substrate for flexible printed wiring board according to the first embodiment includes a laminated body forming step including formation of the laminated body LB2 and an integration step including integration of the formed laminated body LB2 by heating. Here, in the laminated body LB2, as illustrated in FIG. 2C, the reinforcing resin layer 12 and the reinforcing resin layer 13 are respectively stacked on the upper surface and the lower surface of the fluororesin layer 11 having the modified surface through the thermosetting adhesives. Then, the conductor layer is stacked on the reinforcing resin layer 12 and/or the reinforcing resin layer 13 through the thermosetting adhesive.

The method for manufacturing the substrate for flexible printed wiring board according to the first embodiment described above has the following operational effects.

In the present embodiment, the reinforcing resin layers 12 and 13 are stacked on the fluororesin layer 11 having the surface modified by vacuum plasma treatment or the like through the thermosetting adhesives 14 and 15. Then, the thermosetting adhesives 14 and 15 are cured. Thus, strong adhesive strength between the fluororesin layer 11 and the reinforcing resin layers 12 and 13 can be obtained. As a result, separation of the fluororesin layer 11 can be suppressed when the substrate 1 for flexible printed wiring board is bent.

Further, in the present embodiment, the coefficient of thermal expansion of the reinforcing resin layers 12 and 13 is smaller than that of the fluororesin layer 11. Therefore, in the integration step, the expansion of the heated fluororesin layer 11 is limited by the reinforcing resin layers 12 and 13 stacked on the fluororesin layer 11. As a result, the dimensional stability can be ensured. Specifically, by using the reinforcing resin layers 12 and 13 having a coefficient of thermal expansion of 30 ppm/° C. or less, the dimensional stability can be sufficiently ensured.

The reinforcing resin layers 12 and 13 are stacked to vertically sandwich the fluororesin layer 11. Therefore, the expansion of the fluororesin layer 11 during heating is sufficiently suppressed. At the same time, curling of the substrate 1 for flexible printed wiring board can be suppressed.

Further, in the present embodiment, the temperature of the integration step is lower than the melting point of the fluororesin layer 11. Therefore, liquefaction of the fluororesin is prevented. As a result, the residual strain of the fluororesin layer 11 after cooling to room temperature is reduced. Therefore, the dimensional stability can be ensured. Specifically, by heating the laminated body LB2 at a temperature of 250° C. or lower, the dimensional stability can be sufficiently ensured.

As described above, according to the first embodiment, it is possible to provide the method for manufacturing the substrate for flexible printed wiring board having high dimensional stability, that can produce the flexible printed wiring board suitable for transmitting the high frequency signal and capable of suppressing delamination.

<Substrate for Flexible Printed Wiring Board According to First Embodiment>

The substrate 1 for flexible printed wiring board according to the first embodiment obtained by the above manufacturing method will be described with reference to FIG. 3.

The substrate 1 for flexible printed wiring board includes the fluororesin layer 11 having the modified surface, the reinforcing resin layer 12, the reinforcing resin layer 13, the conductor layer 16, and the conductor layer 17. As illustrated in FIG. 3, the layers are bonded by the cured adhesive layers 14$h$, 15$h$, 18$h$ and 19$h$. Here, the cured adhesive layers 14$h$, 15$h$, 18$h$ and 19$h$ are respectively insulating layers containing the thermosetting adhesives 14, 15, 18 and 19 that are thermally cured at the temperature lower than the melting point of the fluororesin layer 11.

The reinforcing resin layer 12 is stacked on the upper surface of the fluororesin layer 11 through the cured adhesive layer 14$h$. The coefficient of thermal expansion of the reinforcing resin layer 12 is smaller than that of the fluororesin layer 11. Further, the reinforcing resin layer 13 is stacked on the lower surface of the fluororesin layer 11 through the cured adhesive layer 15$h$. The coefficient of thermal expansion of the reinforcing resin layer 13 is smaller than that of the fluororesin layer 11. The conductor layer 16 is stacked on the reinforcing resin layer 12 through the cured adhesive layer 18$h$. The conductor layer 17 is stacked on the reinforcing resin layer 13 through the cured adhesive layer 19$h$.

The thickness of each layer of the substrate 1 for flexible printed wiring board is, for example, as follows.

Conductor layer 16: 12 μm
Cured adhesive layer 18$h$: 6 μm
Reinforcing resin layer 12: 12.5 to 25 μm
Cured adhesive layer 14$h$: 12 μm
Fluororesin layer 11: 50 to 75 μm
Cured adhesive layer 15$h$: 12 μm
Reinforcing resin layer 13: 12.5 to 25 μm
Cured adhesive layer 19$h$: 6 μm
Conductor layer 17: 12 μm When the conductor layer is provided only on one surface of the fluororesin layer 11, the conductor layer 16 and the cured adhesive layer 18$h$ (or the conductor layer 17 and the cured adhesive layer 19$h$) are not necessary.

An upper limit of the relative permittivity of the cured adhesive layers 14$h$, 15$h$, 18$h$ and 19$h$ at a frequency of 5 GHz is 3. This relative permittivity is preferably 2.8 or less, and more preferably 2.6 or less. The relative permittivity not more than the upper limit can suppress an increase in dielectric loss when the high frequency signal is transmitted in the flexible printed wiring board produced using the substrate 1 for flexible printed wiring board.

It is more preferable as the lower limit of the dielectric loss tangent of the cured adhesive layers 14$h$, 15$h$, 18$h$ and 19$h$ at a frequency of 5 GHz is smaller. The lower limit of the dielectric loss tangent is preferably 0.005 or less, and more preferably 0.003 or less. The dielectric loss tangent not more than the lower limit can suppress the increase in the transmission loss when the high-frequency signal is transmitted in the flexible printed wiring board produced using the substrate 1 for flexible printed wiring board.

The elastic modulus of the reinforcing resin layers 12 and 13 is preferably 3 GPa or more, and more preferably 6 GPa or more. This can suppress the substrate 1 for flexible printed wiring board from shrinking when the conductor layers 16 and 17 are patterned. Then, the dimensional stability can be improved.

The insulating base material of the substrate 1 for flexible printed wiring board according to the first embodiment includes the fluororesin layer 11. Therefore, the insulating layer between the conductor layer 16 and the conductor layer 17 has a small relative permittivity and dielectric loss tangent. Therefore, the transmission loss of the high frequency signal can be reduced.

Further, the modified surface of the fluororesin layer 11 ensures sufficient adhesive strength with the reinforcing resin layers 12 and 13. Therefore, even if the substrate 1 for flexible printed wiring board is bent, the separation of the fluororesin layer 11 can be suppressed.

Further, it is possible to suppress shrinkage of the fluororesin layer 11 due to small residual strain of the fluororesin layer 11 when the conductor layers 16 and 17 are patterned to form a wiring layer.

Further, the reinforcing resin layers 12 and 13 having a small coefficient of thermal expansion are stacked to vertically sandwich the fluororesin layer 11. Therefore, it is possible to suppress dimensional change when the temperature changes. Therefore, it is possible to suppress problems that occurs due to the temperature change during a heat cycle test of the flexible printed wiring board produced from the substrate 1 for flexible printed wiring board or during use thereof. Here, the problems include occurrence of cracks in plated portions of the conductor layer, through-holes or the like, and separation of the layer from the insulating base material.

The reinforcing resin layers 12 and 13 having the small coefficient of thermal expansion, that are stacked to vertically sandwich the fluororesin layer 11, can also suppress the curling of the flexible printed wiring board produced from the substrate 1 for flexible printed wiring board.

As described above, according to the first embodiment, it is possible to provide the substrate for flexible printed wiring board having high dimensional stability, that can produce the flexible printed wiring board suitable for transmitting the high frequency signal and capable of suppressing delamination.

Second Embodiment

<Method for Manufacturing Substrate for Flexible Printed Wiring Board According to Second Embodiment>

Figure 4:
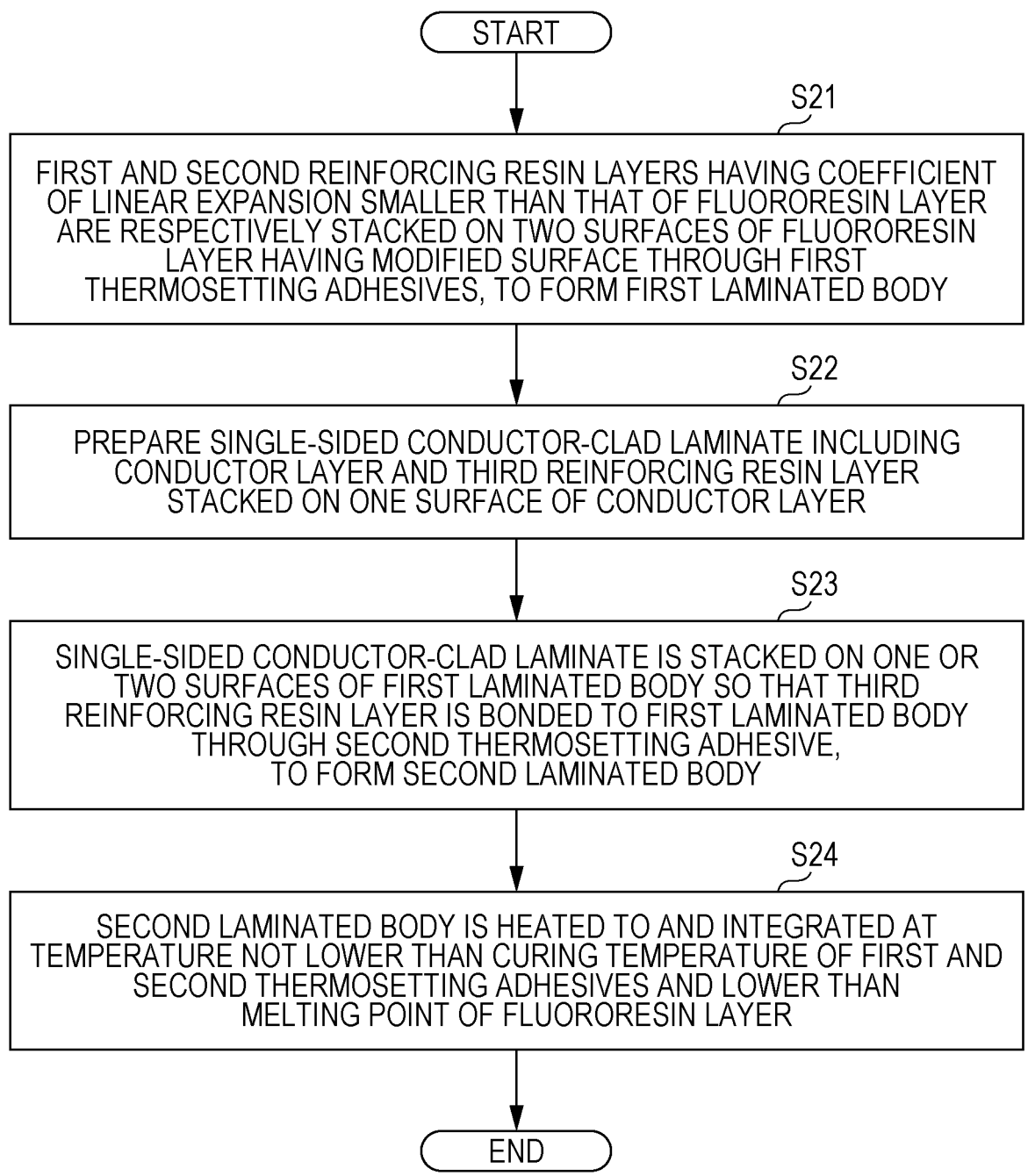
FIG. 4 is a flowchart illustrating a method for manufacturing the substrate for flexible printed wiring board according to a second embodiment.

Next, the method for manufacturing the substrate for flexible printed wiring board according to a second embodiment will be described with reference to a flowchart of FIG. 4.

In the first embodiment, the conductor layer is laminated on the laminated body LB1 through the thermosetting adhesive. The second embodiment is different from the first embodiment in that the single-sided conductor-clad laminate is stacked on the laminated body LB1 through the thermosetting adhesive. The second embodiment will be described focusing on differences from the first embodiment below.

Figure 5A:
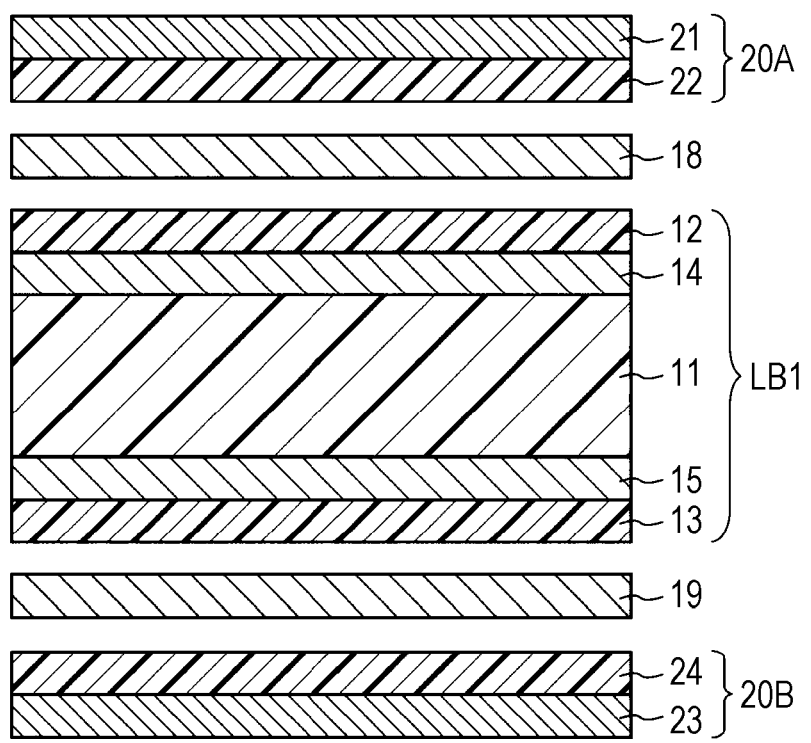
FIG. 5A is a process cross-sectional view for explaining the method for manufacturing the substrate for flexible printed wiring board according to the second embodiment.

First, first and second reinforcing resin layers having a coefficient of thermal expansion smaller than that of the fluororesin layer are respectively stacked on the two surfaces of the fluororesin layer having the modified surface through the first thermosetting adhesives. In this way, the first laminated body is formed (Step S21). In the present embodiment, as illustrated in FIG. 5A, the reinforcing resin layers 12 and 13 having the coefficient of thermal expansion smaller than that of the fluororesin layer 11 are respectively stacked on two surfaces of the fluororesin layer 11 having the modified surface through the thermosetting adhesives 14 and 15. In this way, the laminated body LB1 is formed. This step is the same as Step S11 described in the first embodiment.

Next, the single-sided conductor-clad laminate including the conductor layer and a third reinforcing resin layer stacked on one surface of the conductor layer is prepared (Step S22). In the present embodiment, as illustrated in FIG. 5A, two single-sided conductor-clad laminates 20A and 20B are prepared. The single-sided conductor-clad laminate 20A includes a conductor layer 21 and a reinforcing resin layer 22 stacked on one surface of the conductor layer 21. The single-sided conductor-clad laminate 20B includes a conductor layer 23 and a reinforcing resin layer 24 stacked on one surface of the conductor layer 23. For example, the single-sided conductor-clad laminates 20A and 20B are single-sided copper-clad laminates that include copper foils as the conductor layers 21 and 23. The order of Step S21 and Step S22 may be reversed.

The conductor layers 21 and 23 are conductive layers having the same materials and properties as the conductor layers 16 and 17 described in the first embodiment. Therefore, detailed description thereof will be omitted. Further, the reinforcing resin layers 22 and 24 are reinforcing resin layers having the same materials and properties as the reinforcing resin layers 12 and 13 described in the first embodiment. Therefore, detailed description thereof will be omitted. In the present embodiment, the conductor layers 21 and 23 are copper foils. The reinforcing resin layers 22 and 24 are polyimide. The reinforcing resin layers 22 and 24 may be LCP, PEEK, or the like, as described above.

Figure 5B:
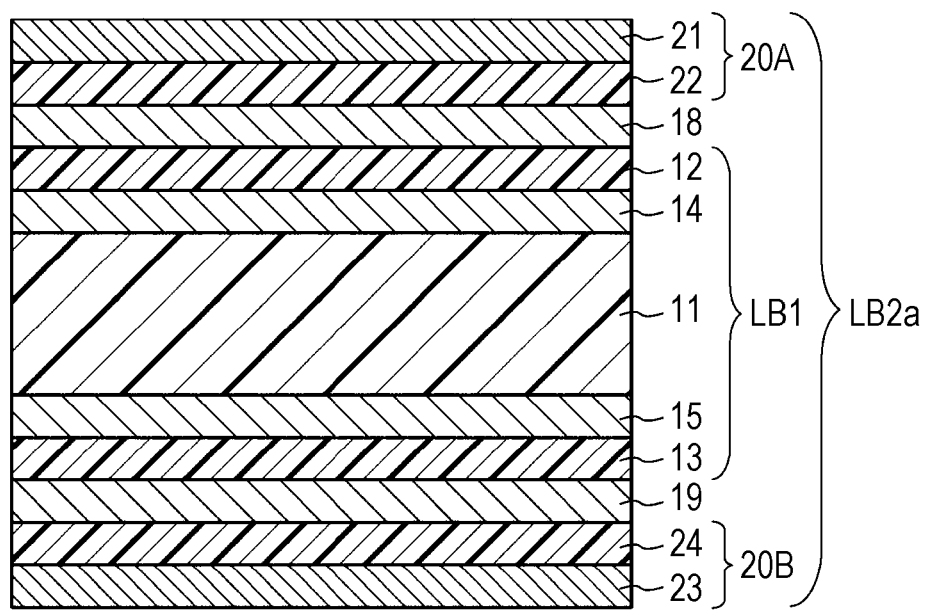
FIG. 5B is a process cross-sectional view subsequent to FIG. 5A, for explaining the method for manufacturing the substrate for flexible printed wiring board according to the second embodiment.

Subsequently, the single-sided conductor-clad laminate is stacked on one or two surfaces of the first laminated body so that the third reinforcing resin layer is bonded to the first laminated body through the second thermosetting adhesive. In this way, the second laminated body is formed (Step S23). In the present embodiment, as illustrated in FIGS. 5A and 5B, the single-sided conductor-clad laminates 20A and 20B are stacked on the two surfaces of the laminated body LB1 so that the reinforcing resin layers 22 and 24 of the single-sided conductor-clad laminates 20A and 20B are bonded to the laminated body LB1 through the thermosetting adhesives 18 and 19. In this way, a laminated body LB2a is formed.

More specifically, in Step S23, as illustrated in FIG. 5A, the single-sided conductor-clad laminate 20A is stacked on an upper surface of the laminated body LB1 so that the reinforcing resin layer 22 is bonded to the laminated body LB1 (reinforcing resin layer 12) through the thermosetting adhesive 18. Further, the single-sided conductor-clad laminate 20B is stacked on a lower surface of the laminated body LB1 so that the reinforcing resin layer 24 is bonded to the laminated body LB1 (reinforcing resin layer 13) through the thermosetting adhesive 19. Thus, as illustrated in FIG. 5B, the laminated body LB2a as the second laminated body is formed.

Subsequently, the second laminated body is heated and integrated to a temperature not lower than the curing temperature of the first and second thermosetting adhesives and lower than the melting point of the fluororesin layer (Step S24). In the present embodiment, the second laminated body is heated to a temperature not lower than the curing temperature of the thermosetting adhesives 14, 15, 18 and 19 and lower than the melting point of the fluororesin layer 11. As a result, the laminated body LB2a is integrated. Details of this step are the same as the integration step (Step S13) described in the first embodiment. The laminated body LB2a is heated under pressure at the curing temperature or higher. As a result, as illustrated in FIG. 6, the thermosetting adhesives 14, 15, 18 and 19 are cured to form the cured adhesive layers 14$h$, 15$h$, 18$h$ and 19$h$.

Figure 6:
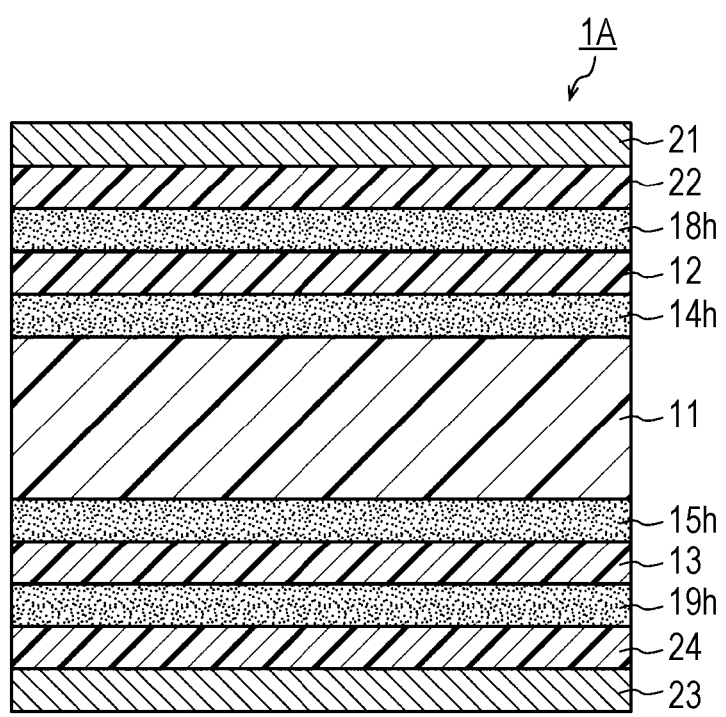
FIG. 6 is a cross-sectional view of the substrate for flexible printed wiring board according to the second embodiment.

Through the steps described above, a substrate 1A for the flexible printed wiring board according to the second embodiment illustrated in FIG. 6 is manufactured.

In the manufacturing method described above, in order to form the laminated body LB2a, the laminated body LB1 is first formed. Then, the single-sided conductor-clad laminates 20A and 20B are stacked. However, the present embodiment is not limited to this. That is, the stacking order of the layers for forming the laminated body LB2a can be appropriately selected. As another example of stacking, first, the reinforcing resin layer 12 is stacked on the upper surface of the fluororesin layer 11 through the thermosetting adhesive 14. Then, the single-sided conductor-clad laminate 20A is stacked on the reinforcing resin layer 12 through the thermosetting adhesive 18 so that the conductor layer 21 faces outward. Subsequently, the reinforcing resin layer 13 is stacked on the lower surface of the fluororesin layer 11 through the thermosetting adhesive 15. Then, the single-sided conductor-clad laminate 20B may be stacked on the reinforcing resin layer 13 through the thermosetting adhesive 19 so that the conductor layer 23 faces outward.

Therefore, it can be understood that the method for manufacturing the substrate for flexible printed wiring board according to the second embodiment includes a laminated body forming step including formation of the laminated body LB2a and an integration step including integration of the formed laminated body LB2a by heating. Here, in the laminated body LB2a, as illustrated in FIG. 5B, the reinforcing resin layer 12 and the reinforcing resin layer 13 are respectively stacked on the upper surface and the lower surface of the fluororesin layer 11 having the modified surface through the thermosetting adhesives. Then, the single-sided conductor-clad laminate 20A (20B) is laminated on the reinforcing resin layer 12 and/or the reinforcing resin layer 13 through the thermosetting adhesive so that the conductor layer faces outward.

The first embodiment and the second embodiment may be combined. That is, the single-sided conductor-clad laminate may be stacked on the upper surface of the laminated body LB1, while the conductor layer may be stacked on the lower surface of the laminated body LB1.

With the method for manufacturing the substrate for flexible printed wiring board according to the second embodiment described above, the same effects as the method for manufacturing the substrate for flexible printed wiring board according to the first embodiment can be obtained.

<Substrate for Flexible Printed Wiring Board According to Second Embodiment>

The substrate 1A for flexible printed wiring board according to the second embodiment obtained by the above manufacturing method will be described with reference to FIG. 6.

The substrate 1A for flexible printed wiring board includes the fluororesin layer 11 having the modified surface, the reinforcing resin layer 12, the reinforcing resin layer 13, the reinforcing resin layer 22, the reinforcing resin layer 24, the conductor layer 21, and the conductor layer 23. As illustrated in FIG. 6, except for the conductor layers 21 and 23, the respective layers are bonded by the cured adhesive layers 14h, 15h, 18h and 19h.

The reinforcing resin layer 12 is stacked on the upper surface of the fluororesin layer 11 through the cured adhesive layer 14h. The coefficient of thermal expansion of the reinforcing resin layer 12 is smaller than that of the fluororesin layer 11. Further, the reinforcing resin layer 13 is stacked on the lower surface of the fluororesin layer 11 through the cured adhesive layer 15h. The coefficient of thermal expansion of the reinforcing resin layer 13 is smaller than that of the fluororesin layer 11.

The reinforcing resin layer 22 is stacked on the reinforcing resin layer 12 through the cured adhesive layer 18h. Further, the reinforcing resin layer 24 is stacked on the reinforcing resin layer 13 through the cured adhesive layer 19h. The coefficient of thermal expansion of the reinforcing resin layers 22 and 24 is smaller than that of the fluororesin layer 11. The conductor layer 21 is stacked on the reinforcing resin layer 22. The conductor layer 23 is stacked on the reinforcing resin layer 24.

The thickness of each layer of the substrate 1A for flexible printed wiring board is, for example, as follows.

Conductor layer 21: 12 μm
Reinforcing resin layer 22: 12 μm
Cured adhesive layer 18h: 6 μm
Reinforcing resin layer 12: 12.5 to 25 μm
Cured adhesive layer 14h: 12 μm
Fluororesin layer 11: 50 to 75 μm
Cured adhesive layer 15h: 12 μm
Reinforcing resin layer 13: 12.5 to 25 μm
Cured adhesive layer 19h: 6 μm
Reinforcing resin layer 24: 12 μm
Conductor layer 23: 12 μm With the substrate for flexible printed wiring board according to the second embodiment, the same effects as the substrate for flexible printed wiring board according to the first embodiment can be obtained.

Third Embodiment

<Method for Manufacturing Substrate for Flexible Printed Wiring Board According to Third Embodiment>

Figure 7:
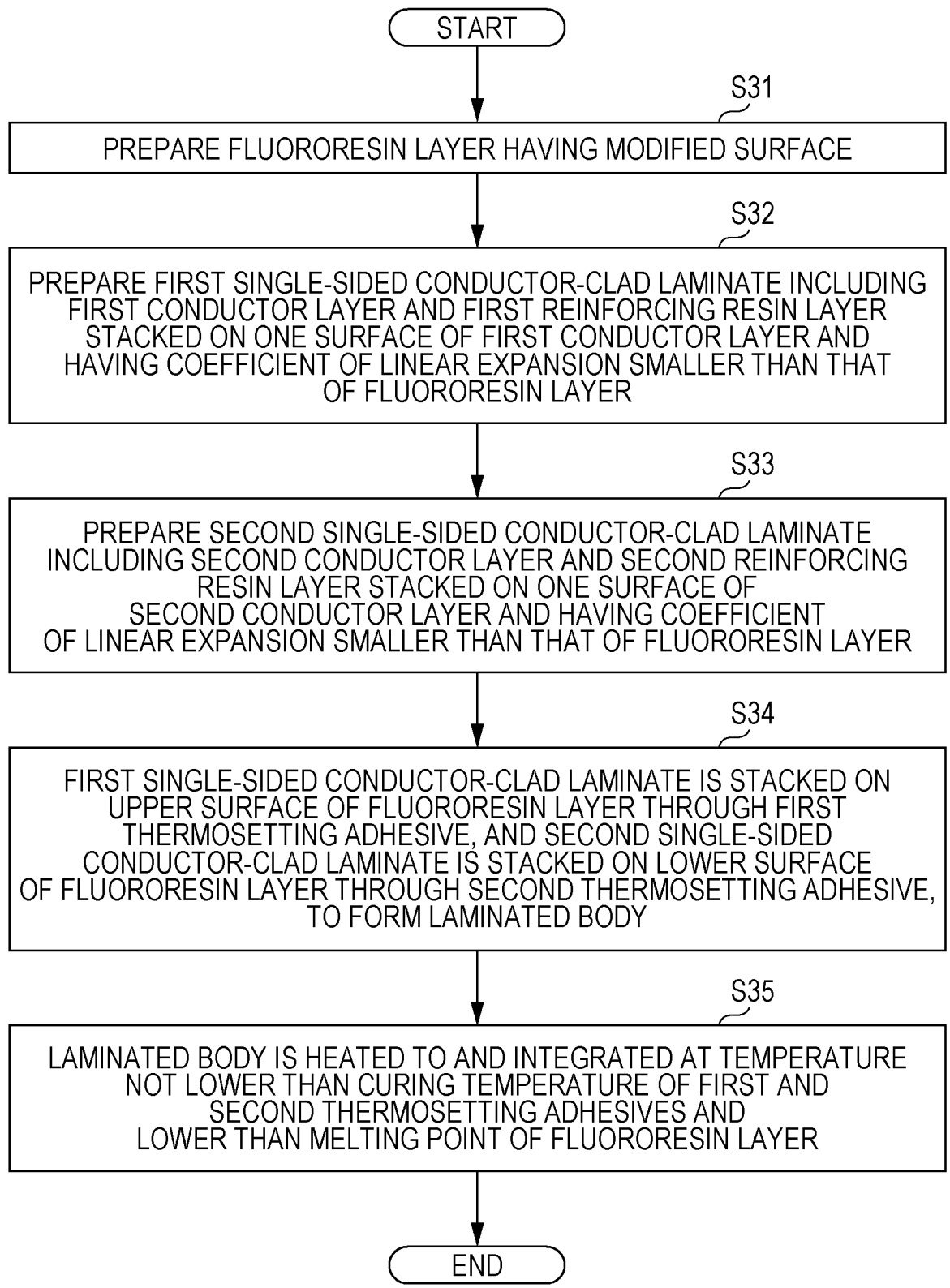
FIG. 7 is a flowchart illustrating a method for manufacturing the substrate for flexible printed wiring board according to a third embodiment.

Next, the method for manufacturing the substrate for flexible printed wiring board according to a third embodiment will be described with reference to a flowchart of FIG. 7.

In the first and second embodiments, the conductor layer or the single-sided conductor-clad laminate is bonded to the laminated body LB1. The third embodiment is different from the first and second embodiments in that the single-sided conductor-clad laminate is stacked on the fluororesin layer. The third embodiment will be described focusing on differences from the first and second embodiments below.

First, the fluororesin layer 11 having the modified surface is prepared (Step S31).

Figure 8A:
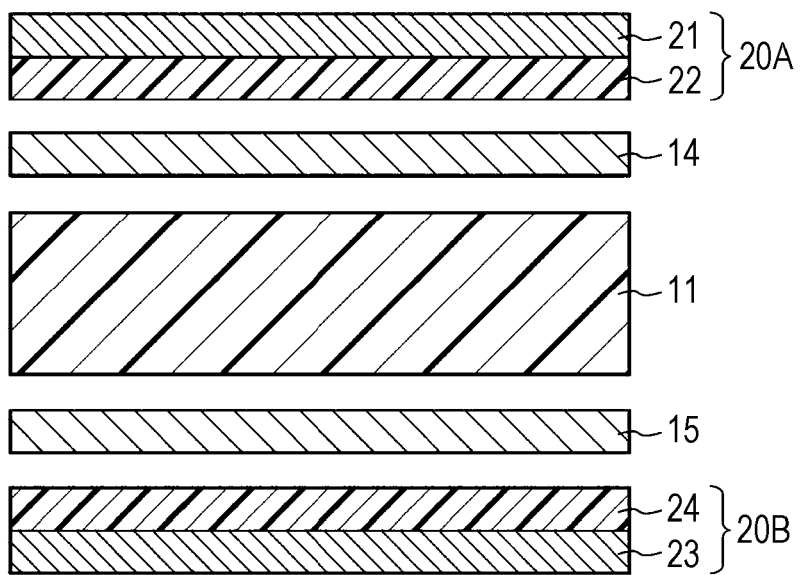
FIG. 8A is a process cross-sectional view for explaining the method for manufacturing the substrate for flexible printed wiring board according to the third embodiment.

Subsequently, there is prepared a first single-sided conductor-clad laminate including a first conductor layer and a first reinforcing resin layer stacked on one surface of the first conductor layer and having a coefficient of thermal expansion smaller than that of the fluororesin layer (Step S32). In the present embodiment, as illustrated in FIG. 8A, the single-sided conductor-clad laminate 20A including the conductor layer 21 and the reinforcing resin layer 22 stacked on one surface of the conductor layer 21 is prepared. Like the reinforcing resin layer 12, the reinforcing resin layer 22 has a coefficient of thermal expansion smaller than that of the fluororesin layer 11.

Subsequently, there is prepared a second single-sided conductor-clad laminate including a second conductor layer and a second reinforcing resin layer stacked on one surface of the second conductor layer and having a coefficient of thermal expansion smaller than that of the fluororesin layer (Step S33). In the present embodiment, as illustrated in FIG. 8A, the single-sided conductor-clad laminate 20B including the conductor layer 23 and the reinforcing resin layer 24 stacked on one surface of the conductor layer 23 is prepared. Like the reinforcing resin layer 13, the reinforcing resin layer 24 has a coefficient of thermal expansion smaller than that of the fluororesin layer 11.

The reinforcing resin layers 22 and 24 of the single-sided conductor-clad laminates 20A and 20B preferably have the same materials and properties (coefficient of thermal expansion, elastic modulus, and the like) as the reinforcing resin layers 12 and 13 described in the first and second embodiments.

Figure 8B:
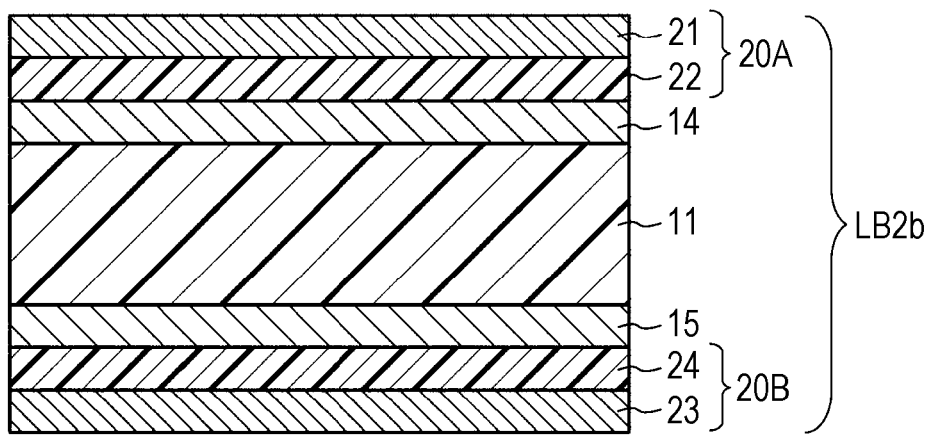
FIG. 8B is a process cross-sectional view subsequent to FIG. 8A, for explaining the method for manufacturing the substrate for flexible printed wiring board according to the third embodiment.

Subsequently, the first single-sided conductor-clad laminate is stacked on the upper surface of the fluororesin layer through the first thermosetting adhesive. The second single-sided conductor-clad laminate is stacked on the lower surface of the fluororesin layer through the second thermosetting adhesive. In this way, the laminated body is formed (Step S34). In the present embodiment, as illustrated in FIGS. 8A and 8B, the single-sided conductor-clad laminate 20A is stacked on the upper surface of the fluororesin layer 11 through the thermosetting adhesive 14 so that the conductor layer 21 faces outward. The single-sided conductor-clad laminate 20B is stacked on the lower surface of the fluororesin layer 11 through the thermosetting adhesive 15 so that the conductor layer 23 faces outward. In this way, the laminated body LB2b is formed.

Subsequently, the laminated body formed in Step S34 is heated and integrated to a temperature not lower than the curing temperature of the first and second thermosetting adhesives and lower than the melting point of the fluororesin layer (Step S35). In the present embodiment, the laminated body LB2b formed in Step S34 is heated and integrated to a temperature not lower than the curing temperature of the thermosetting adhesives 14 and 15 and lower than the melting point of the fluororesin layer 11. Details of this step are the same as the integration step (Step S13) described in the first embodiment. The laminated body LB2b is heated under pressure at the curing temperature or higher. As a result, the thermosetting adhesives 14 and 15 are cured to integrate the laminated body LB2b.

Figure 9:
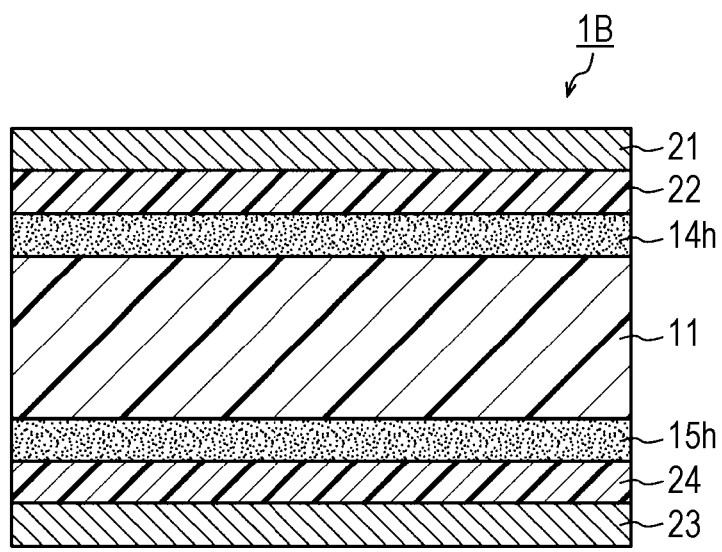
FIG. 9 is a cross-sectional view of the substrate for flexible printed wiring board according to the third embodiment.

Through the steps described above, the substrate 1B for flexible printed wiring board according to the third embodiment illustrated in FIG. 9 is manufactured.

With the method for manufacturing the substrate for flexible printed wiring board according to the third embodiment described above, the same effects as the method for manufacturing the substrate for flexible printed wiring board according to the first embodiment can be obtained.

Further, according to the third embodiment, the number of manufacturing steps can be reduced as compared with the first and second embodiments.

<Substrate for Flexible Printed Wiring Board According to Third Embodiment>

The substrate 1B for flexible printed wiring board according to the third embodiment obtained by the above manufacturing method will be described with reference to FIG. 9.

The substrate 1B for flexible printed wiring board includes the fluororesin layer 11 having the modified surface, the reinforcing resin layer 22, the reinforcing resin layer 24, the conductor layer 21, and the conductor layer 23. The fluororesin layer 11 and the reinforcing resin layer 22 are bonded by the cured adhesive layer 14h. The fluororesin layer 11 and the reinforcing resin layer 24 are bonded by the cured adhesive layer 15h.

The reinforcing resin layer 22 is stacked on the upper surface of the fluororesin layer 11 through the cured adhesive layer 14h. The coefficient of thermal expansion of the reinforcing resin layer 22 is smaller than that of the fluororesin layer 11. Further, the reinforcing resin layer 24 is stacked on the lower surface of the fluororesin layer 11 through the cured adhesive layer 15h. The coefficient of thermal expansion of the reinforcing resin layer 24 is smaller than that of the fluororesin layer 11. The conductor layer 21 is stacked on the reinforcing resin layer 22. The conductor layer 23 is stacked on the reinforcing resin layer 24. The conductor layer 21 is stacked on the reinforcing resin layer 22. The conductor layer 23 is stacked on the reinforcing resin layer 24. The cured adhesive layers 14h and 15h are the same as in the first embodiment.

The thickness of each layer of the substrate 1B for flexible printed wiring board is, for example, as follows.
Conductor layer 21: 12 µm
Reinforcing resin layer 22: 24 µm
Cured adhesive layer 14h: 12 µm
Fluororesin layer 11: 50 to 75 µm
Cured adhesive layer 15h: 12 µm
Reinforcing resin layer 24: 24 µm
Conductor layer 23: 12 µm With the substrate for flexible printed wiring board according to the third embodiment, the same effects as the substrate for flexible printed wiring board according to the first embodiment can be obtained.

Three embodiments have been described above. The embodiments may be appropriately combined. That is, as a laminating method on the upper surface of the fluororesin layer 11, any one of laminating methods described in the first to third embodiments may be employed, while a laminating method of an embodiment different from that of the upper surface may be employed on the lower surface of the fluororesin layer 11.

The substrate for flexible printed wiring board according to the present embodiment can be applied to high-frequency wiring materials such as high-frequency flat cables, high-frequency electric wires, and high-frequency antennas.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A method for manufacturing a substrate for flexible printed wiring board, comprising
a laminated body forming step and an integration step, wherein
in the laminated body forming step,
on an upper surface and a lower surface of a fluororesin layer having a modified surface, a first and second reinforcing resin layers having a coefficient of thermal expansion smaller than that of the fluororesin layer are respectively stacked through a first thermosetting adhesive,
on the first reinforcing resin layer and/or the second reinforcing resin layer, a conductor layer is stacked through a second thermosetting adhesive, to form a laminated body, and
in the integration step,
the laminated body is heated and integrated at a temperature not lower than a curing temperature of the first and second thermosetting adhesives and lower than a melting point of the fluororesin layer,
wherein the first thermosetting adhesive is formed over an entire surface of the fluororesin layer.

2. The method for manufacturing the substrate for flexible printed wiring board according to claim 1, wherein
the laminated body forming step comprises:
forming a first laminated body by stacking the first reinforcing resin layer and the second reinforcing resin layer respectively on the upper surface and the lower surface of the fluororesin layer through the first thermosetting adhesive; and
forming a second laminated body as the laminated body by stacking a conductor layer on one or two surfaces of the first laminated body through the second thermosetting adhesive.

3. A method for manufacturing a substrate for flexible printed wiring board, comprising
a laminated body forming step and an integration step, wherein
in the laminated body forming step,
on an upper surface and a lower surface of a fluororesin layer having a modified surface, a first and second reinforcing resin layers having a coefficient of thermal expansion smaller than that of the fluororesin layer are respectively stacked through a first thermosetting adhesive,
on the first reinforcing resin layer and/or the second reinforcing resin layer, a single-sided conductor-clad laminate including a conductor layer and a third reinforcing resin layer stacked on one surface of the conductor layer is stacked through a second thermosetting adhesive so that the conductor layer faces outward, to form a laminated body, and
in the integration step,
the laminated body is heated and integrated at a temperature not lower than a curing temperature of the first and second thermosetting adhesives and lower than a melting point of the fluororesin layer.

4. The method for manufacturing the substrate for flexible printed wiring board according to claim 3, wherein
the laminated body forming step comprises:
forming a first laminated body by stacking the first reinforcing resin layer and the second reinforcing resin layer respectively on the upper surface and the lower surface of the fluororesin layer through the first thermosetting adhesive;
preparing the single-sided conductor-clad laminate having the conductor layer, and the third reinforcing resin layer stacked on one surface of the conductor layer; and
forming a second laminated body as the laminated body by stacking the single-sided conductor-clad laminate on one or two surfaces of the first laminated body so that the third reinforcing resin layer is bonded to the first laminated body through the second thermosetting adhesive.

5. A method for manufacturing a substrate for flexible printed wiring board, comprising:
preparing a fluororesin layer having a modified surface;
preparing a first single-sided conductor-clad laminate including a first conductor layer and a first reinforcing resin layer stacked on one surface of the first conductor layer and having a coefficient of thermal expansion smaller than that of the fluororesin layer;
preparing a second single-sided conductor-clad laminate including a second conductor layer and a second reinforcing resin layer stacked on one surface of the second conductor layer and having a coefficient of thermal expansion smaller than that of the fluororesin layer; and
a laminated body forming step and an integration step, wherein in the laminated body forming step,
on an upper surface of the fluororesin layer, the first single-sided conductor-clad laminate is stacked through a first thermosetting adhesive so that the first conductor layer faces outward,
on a lower surface of the fluororesin layer, the second single-sided conductor-clad laminate is stacked through a second thermosetting adhesive so that the second conductor layer faces outward, to form a laminated body, and
in the integration step,
the laminated body is heated and integrated at a temperature not lower than a curing temperature of the first and second thermosetting adhesives and lower than a melting point of the fluororesin layer,
wherein the first thermosetting adhesive is formed over an entire surface of the fluororesin layer.

6. The method for manufacturing the substrate for flexible printed wiring board according to claim 1, wherein the integration step comprises heating the laminated body at a temperature of 250° C. or lower.

7. The method for manufacturing the substrate for flexible printed wiring board according to claim 1, wherein the first and second reinforcing resin layers have a coefficient of thermal expansion of 30 ppm/° C. or less.

8. The method for manufacturing the substrate for flexible printed wiring board according to claim 1, wherein the first and second reinforcing resin layers have a coefficient of thermal expansion of 50 ppm/° C. or less and an elastic modulus of 3 GPa or more.

9. The method for manufacturing the substrate for flexible printed wiring board according to claim 1, wherein the first and second reinforcing resin layers have an elastic modulus of 3 GPa or more.

10. The method for manufacturing the substrate for flexible printed wiring board according to claim 1, wherein the first and second reinforcing resin layers are made of liquid crystal polymer (LCP), polyetheretherketone (PEEK), or polyimide.

11. The method for manufacturing the substrate for flexible printed wiring board according to claim 1, wherein the conductor layer has a ten-point average roughness of 2.0 μm or less.

12. The method for manufacturing the substrate for flexible printed wiring board according to claim 5, wherein the first and second conductor layers have a ten-point average roughness of 2.0 μm or less.

13. A substrate for flexible printed wiring board, comprising:
a fluororesin layer having a modified surface;
a first reinforcing resin layer stacked on an upper surface of the fluororesin layer through a first cured adhesive layer and having a coefficient of thermal expansion smaller than that of the fluororesin layer;
a second reinforcing resin layer stacked on a lower surface of the fluororesin layer through a second cured adhesive layer and having a coefficient of thermal expansion smaller than that of the fluororesin layer; and
a conductor layer stacked on the first reinforcing resin layer and/or the second reinforcing resin layer through a third cured adhesive layer,
wherein the first cured adhesive layer is formed over an entire surface of the fluororesin layer.

14. A substrate for flexible printed wiring board, comprising:
a fluororesin layer having a modified surface;

a first reinforcing resin layer stacked on an upper surface of the fluororesin layer through a first cured adhesive layer and having a coefficient of thermal expansion smaller than that of the fluororesin layer;
a second reinforcing resin layer stacked on a lower surface of the fluororesin layer through a second cured adhesive layer and having a coefficient of thermal expansion smaller than that of the fluororesin layer;
a third reinforcing resin layer stacked on the first reinforcing resin layer and/or the second reinforcing resin layer through a third cured adhesive layer; and
a conductor layer stacked on the third reinforcing resin layer.

15. A substrate for flexible printed wiring board, comprising:
a fluororesin layer having a modified surface;
a first reinforcing resin layer stacked on an upper surface of the fluororesin layer through a first cured adhesive layer and having a coefficient of thermal expansion smaller than that of the fluororesin layer;
a second reinforcing resin layer stacked on a lower surface of the fluororesin layer through a second cured adhesive layer and having a coefficient of thermal expansion smaller than that of the fluororesin layer; and
a conductor layer stacked on the first reinforcing resin layer and/or the second reinforcing resin layer,
wherein the first cured adhesive layer is formed over an entire surface of the fluororesin layer.

* * * * *